United States Patent [19]
Ahn et al.

[11] Patent Number: 5,817,437
[45] Date of Patent: Oct. 6, 1998

[54] METHOD FOR DETECTING PHASE ERROR OF A PHASE SHIFT MASK

[75] Inventors: Chang Nam Ahn; Hung Eil Kim, both of Ichon-shi, Rep. of Korea

[73] Assignee: Hyundai Electronics Industries Co., Ltd., Ichon-shi, Rep. of Korea

[21] Appl. No.: 725,162

[22] Filed: Oct. 3, 1996

[30] Foreign Application Priority Data

Oct. 4, 1995 [KR] Rep. of Korea .................. 95-33878

[51] Int. Cl.[6] ..................................................... G03F 9/00
[52] U.S. Cl. .............................................................. 430/5
[58] Field of Search .............................. 430/5, 322, 323, 430/324

[56] References Cited

U.S. PATENT DOCUMENTS 5,382,484 1/1995 Hosono ........................................ 430/5
5,439,767 8/1995 Yamashita et al. ......................... 430/5
5,536,603 7/1996 Tsuchiya et al. ........................... 430/5

*Primary Examiner*—S. Rosasco
*Attorney, Agent, or Firm*—Reid & Priest LLP

[57] ABSTRACT

A method for detecting the phase error of a phase shift mask simply and with ease is disclosed and comprises the steps of: arranging a plurality of phase shift patterns, each having a predetermined width and serving to shift the light transmitted through predetermined regions of a transparent substrate of the phase shift mask, at a regular space on the transparent substrate; arranging a pattern for detecting phase error in which a light screen with a predetermined width is located between the predetermined regions of the transparent substrate and the phase shift mask; patterning a wafer by use of the phase shift mask and the patterns for detecting phase error; comparing the sizes by defocuses of the patterns in which phase is shifted with those of the patterns in which phase is not shifted; and utilizing the difference in the pattern size to detect the phase error.

19 Claims, 4 Drawing Sheets

METHOD FOR DETECTING PHASE ERROR OF A PHASE SHIFT MASK

BACKGROUND OF THE INVENTION

1. Field of the Invention

The present invention relates to a method for detecting the phase error of a phase shift mask, and more particularly to an improvement in accuracy and simplicity in detecting the phase error of a phase shift mask.

2. Description of the Prior Art

In general, the phase error of a phase shift mask is detected during fabrication of the mask.

Many techniques were researched and developed to detect the phase error but, until recently, it has been found that there is no detecting method in which patterns are transcribed on a wafer.

SUMMARY OF THE INVENTION

Therefore, it is an objective of the present invention to provide a method for detecting the phase error of a phase shift mask, which takes advantage of the phenomenon that the patterns exposed on a wafer are shifted by defocus whereby the phase error can be easily detected.

It is another objective of the present invention to provide a method for accurately detecting the phase error of a phase shift mask, applicable for the fabrication of highly integrated semiconductor devices.

In accordance with the present invention, a method for detecting the phase error of a phase shift mask, comprises the steps of:

providing a transparent substrate that includes a lower surface; etching the lower surface of the transparent substrate to form, at a regular spacing, a plurality of phase shift patterns, each phase shift pattern having a predetermined width and serving to shift the light transmitted through predetermined regions of the transparent substrate; forming a phase shift mask in which a light screen with a predetermined width is located between the predetermined regions of the transparent substrate and the phase shift patterns; forming a pattern on a wafer using the phase shift mask; comparing sizes of patterns in which phase is shifted with sizes of patterns in which phase is not shifted, to arrive at a difference in pattern size; and detecting the phase error by using the difference in pattern size.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The application of the preferred embodiments of the present invention is best understood with reference to the accompanying drawings.

Figure 1:
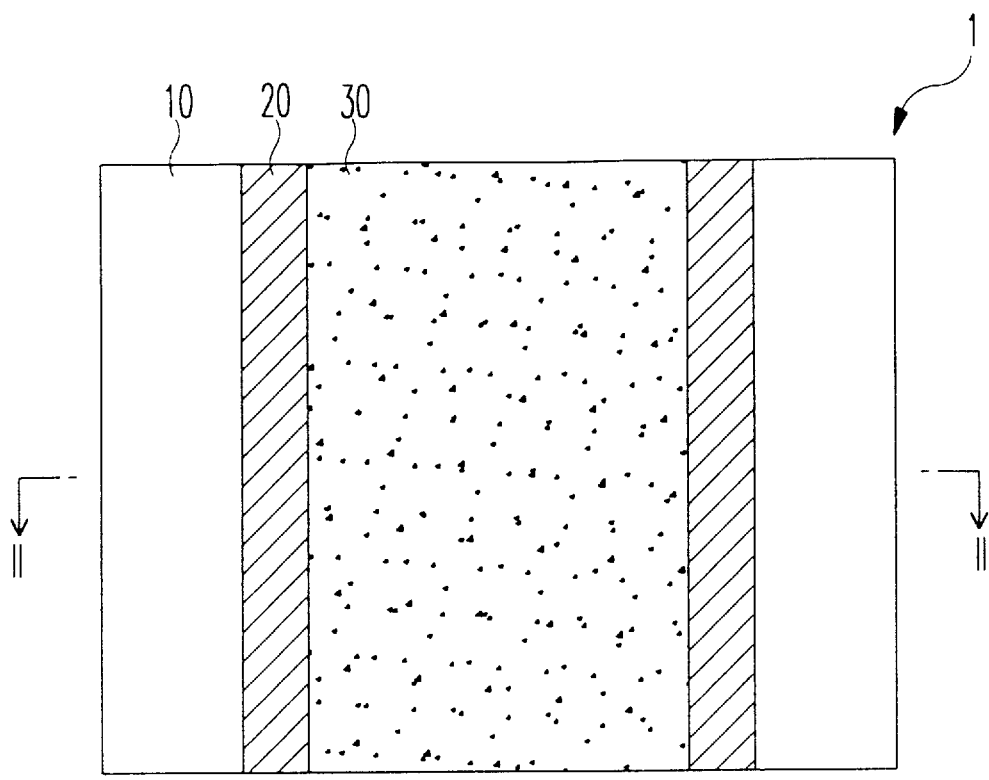
FIG. 1 is a schematic plan view of a phase shift mask illustrating the principle of detecting the phase error, according to the present invention.
Figure 2:
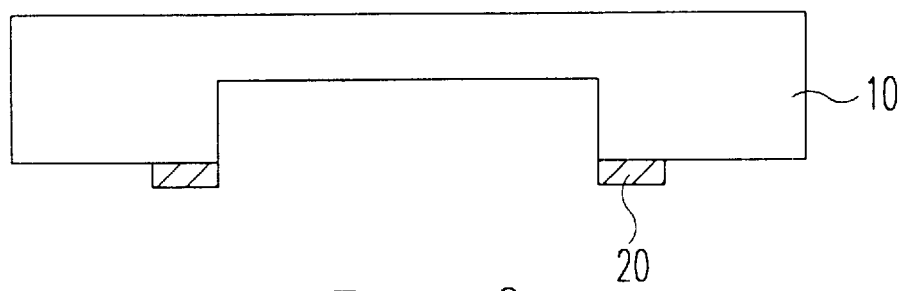
FIG. 2 is a schematic cross sectional view taken along line II—II of FIG. 1.

FIG. 1 shows a typical phase shift mask in a top view while its sectional view, taken along through line II—II of FIG. 1, is in FIG. 2.

Such a phase shift mask, as shown in FIG. 1, is generally used to form line and space patterns. From the shape shown in FIG. 2, the phase shift mask of FIG. 1 is found to be of a quartz etch type in which the lower surface of a transparent quartz substrate is selectively etched. This phase shift mask comprises a quartz substrate 10, a chrome part 20 attached on the lower surface of the substrate, which functions as a light screen, and a shift region 30 which shifts light in the inner direction of the chrome part 20.

Where such a phase shift mask is applied, the phase angle is typically 180°. However, if the depth of etch in the quartz substrate is not accurate, the phase angle deviates from 180°.

Figure 3:
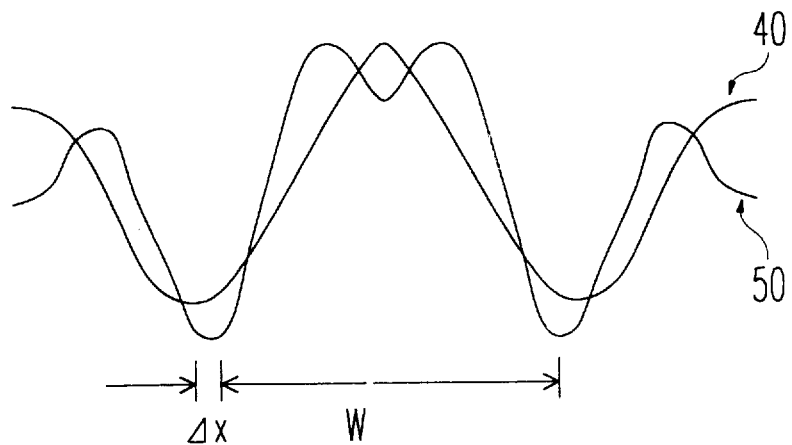
FIG. 3 shows the intensity distribution of light plotted with regard to the pattern's position when phase error occurs by use of the phase shift mask of FIG. 1.

When the above phase shift mask is used, the intensities of light resulting from the phase error are distributed with regard to the position of pattern, as shown in FIG. 3.

In FIG. 3, the plot designated as reference numeral "40" shows that the intensity distribution of light is most focused while the plot designated as reference numeral "50" does so at defocus. As is apparent from the figure, the position of the pattern corresponding to the chrome line 20 moves away a certain distance. The distance which the pattern moves away, $\Delta X$, is proportional to the defocus and the inaccurate extent of the phase angle.

Figure 4:
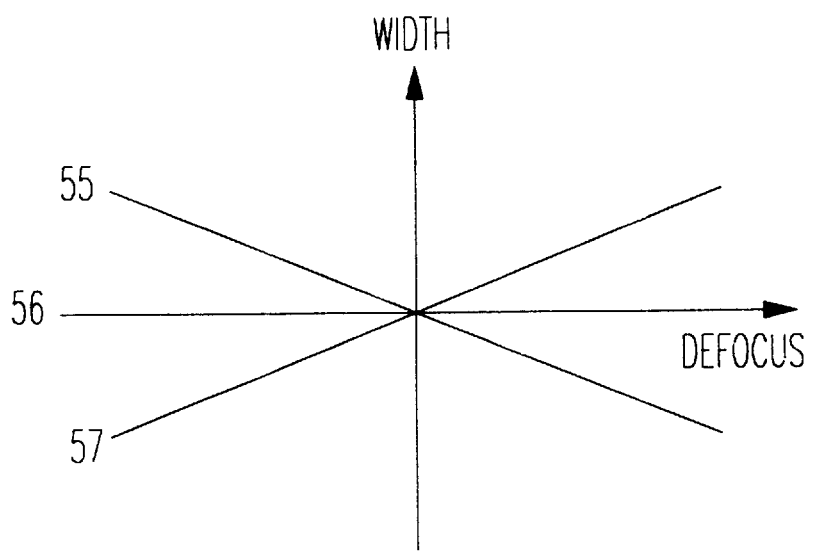
FIG. 4 is a graph rearranging the plot of FIG. 3.

FIG. 4 is a graph rearranging the above phenomenon. That is, as shown in FIG. 4, the width of the pattern is in proportion to the defocus. Line 55 shows for the case wherein the phase angle is smaller than 180°. And line 56 has a phase angle of 180° while line 57 has a phase angle larger than 180°.

As seen in FIG. 4, if the phase error of the phase shift mask does not vary with defocus, that there seems to be no phase error.

Figure 5:
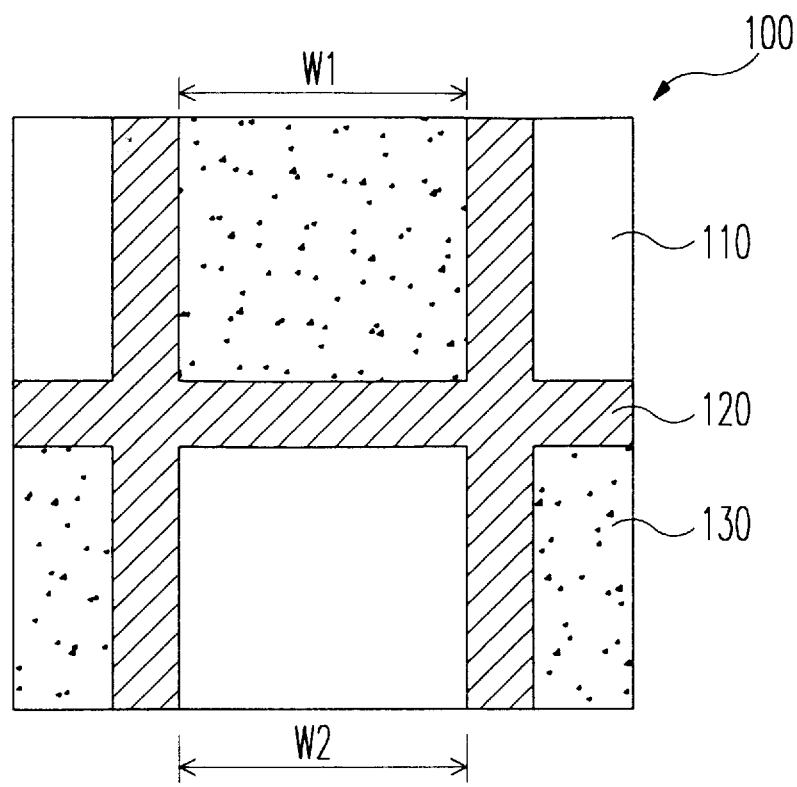
FIG. 5 is a plan view of a mask pattern for detecting phase error of a phase shift mask, in accordance with a first embodiment of the present invention.

FIG. 5 is a mask pattern for detecting the phase error of a phase shift mask, according to a first embodiment of the present invention. As shown in FIG. 5, a mask pattern 100 for detecting the phase error of phase shift mask has a matrix layout in which a plurality of rectangular phase shift patterns 130, each with a certain width W1, are diagonally arranged. Correspondingly, the other transparent substrate regions are diagonally positioned with a certain width W2. In the mask pattern 100, there is a light screen 120 between the rectangular phase shift patterns 130 and the transparent substrate regions 110.

This pattern 100 for detecting phase error is set on a predetermined position of the phase shift mask. Then, patterning is carried out on a wafer (not shown). Measurements are made for the widths of the pattern for detecting phase error, W1 and W2, by defocuses and they are compared with each other. If W1 and W2 are within an allowable error, there is no phase error.

Figure 6:
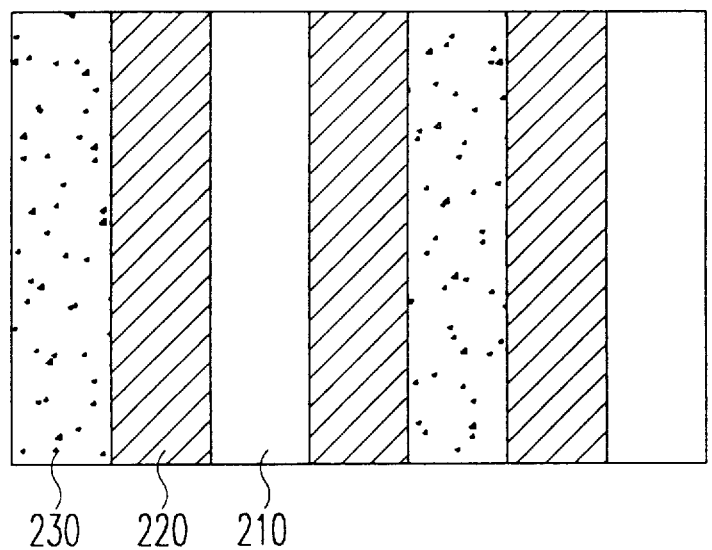
FIG. 6 is a plan view of a mask pattern for detecting phase error of a phase shift mask, in accordance with a second embodiment of the present invention.

Referring to FIG. 6, a pattern for detecting phase error, according to a second embodiment of the present invention is shown. As illustrated in FIG. 6, the pattern 200 comprises a plurality of repeating forms in which an I-shaped phase shift pattern 230 with a certain width is sandwiched between two light screens 220, each being flanked by a transparent substrate region 210.

Figure 7:
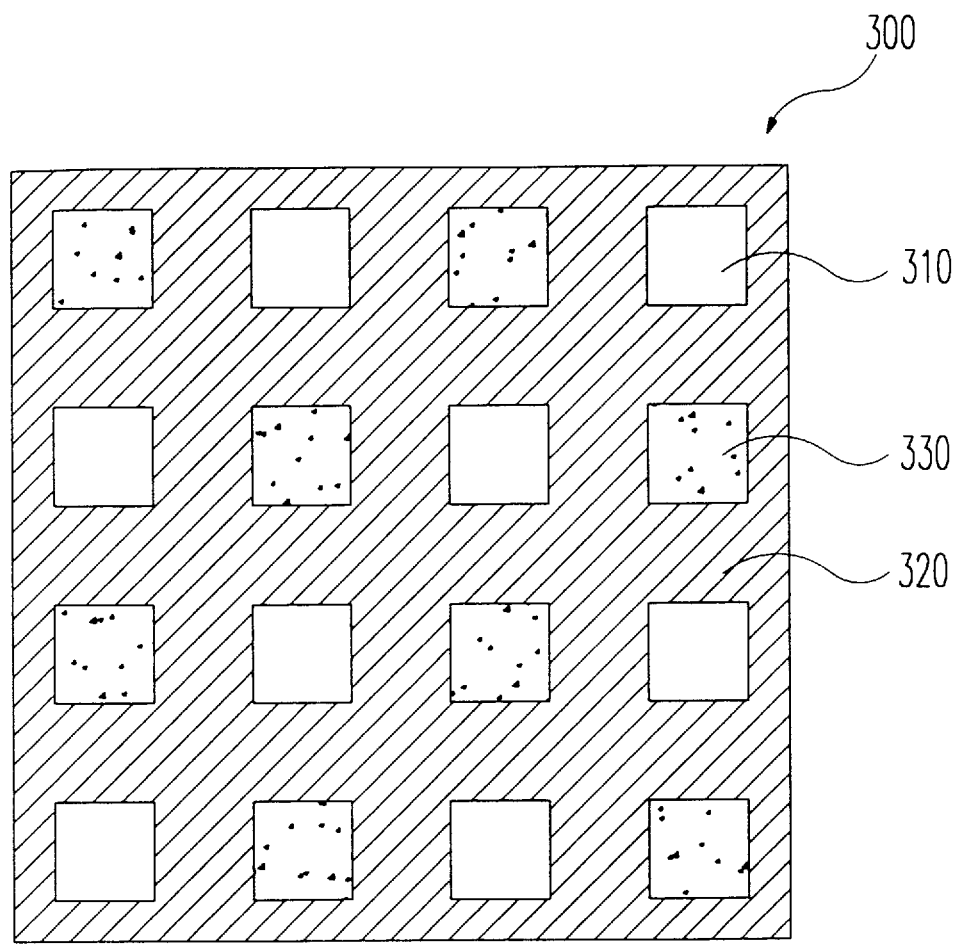
FIG. 7 is a plan view of a mask pattern for detecting phase error of a phase shift mask, in accordance with a third embodiment of the present invention.

Turning now to FIG. 7, a pattern for detecting phase error, according to a third embodiment of the present invention is shown. In the pattern 300, as seen in FIG. 7, a plurality of rectangular phase shift patterns 330 are arranged at a regular distance in row and in column. Rectangular transparent substrate regions 310 are located between the phase shift patterns 330. Both the phase shift patterns 330 and the parent substrate regions 310 are surrounded by a light screen 320.

According to the present invention, the phase shift patterns and the transparent substrate regions may be arranged at the same distance or different distances. As for shape, the phase shift patterns 330 and the transparent substrate regions 310 are rectangular or square. It should be noted that the phase shift patterns 330 may serve to form contact holes.

Patterning is made on a wafer, using the phase shift masks according to the present invention. In the case that the employed photoresist is of a positive type, the space sizes of the pattern where a phase shift occurs are measured and compared with those of the pattern where no phase shift occurs, by defocuses, to detect the phase error.

For negative photoresist, it is effective for the detection of phase error that the line size of the pattern where phase is shifted on the wafer is compared with that of the pattern where phase is not shifted, by defocuses.

As described above, the detecting method of phase error according to the present invention is very advantageous in some aspects. Detecting the phase error of a phase shift mask can be easily and effectively accomplished by comparing the sizes of the patterns in which phase shift occurs with those of the patterns where the phase does not shift. In addition, the method according to the present invention is very useful for the fabrication of highly integrated semiconductor devices by virtue of its accuracy in detecting the phase error.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for detecting a phase error of a phase shift mask, comprising:
   a) providing a transparent substrate that includes a lower surface;
   b) etching the lower surface of the transparent substrate to form, at a regular spacing, a plurality of phase shift patterns, each phase shift pattern having a predetermined width and serving to shift the light transmitted through predetermined regions of the transparent substrate;
   c) forming a phase shift mask in which a light screen with a predetermined width is located between the predetermined regions of the transparent substrate and the phase shift patterns;
   d) forming a pattern on a wafer using the phase shift mask;
   e) comparing (A) sizes of patterns in which phase is shifted with (B) sizes of patterns in which phase is not shifted, to arrive at a difference in pattern size; and
   f) detecting the phase error by using the difference in pattern size.

2. The method of claim 1, wherein:
   the light screen includes chrome.

3. The method of claim 1, wherein:
   the light screen has a line width of about 0.1 $\mu$m or more.

4. The method of claim 1, wherein:
   the pattern forming step is carried out with a positive photoresist; and
   the comparing step is carried out for a size of the spaces of patterns in which phase is shifted with a size of the spaces of patterns in which phase is not shifted.

5. The method of claim 1, wherein:
   the pattern forming step is carried out with a negative photoresist; and
   the comparing step is carried out for a size of the line of patterns in which phase is shifted with a size of the line of patterns in which phase is not shifted.

6. The method of claim 1, wherein:
   the phase shift patterns are arranged diagonally to form a matrix layout.

7. The method of claim 6, wherein:
   each of the phase shift patterns has a rectangular form with a predetermined width.

8. The method of claim 1, wherein the phase shift mask includes:
   a plurality of repeating forms in which an I-shaped phase shift pattern with a certain width is sandwiched between two light screens, each being flanked by a transparent substrate region.

9. The method of claim 8, wherein:
   the light screen includes chrome.

10. The method of claim 8, wherein:
    the light screen has a line width of about 0.1 $\mu$m or more.

11. The method of claim 8, wherein:
    the pattern forming step is carried out with a positive photoresist; and
    the comparing step is carried out for a size of the spaces of patterns in which phase is shifted with a size of the spaces of patterns in which phase is not shifted.

12. The method of claim 8, wherein:
    the pattern forming step is carried out with a negative photoresist; and
    the comparing step is carried out for a size of the line of patterns in which phase is shifted with a size of the line of patterns in which phase is not shifted.

13. The method of claim 1, wherein:
    a) the phase shift mask includes:
       1) a plurality of rectangular phase shift patterns; and
       2) a plurality of rectangular transparent substrate regions; and
    b) said phase shift patterns and said transparent substrate regions alternate at a regular distance in rows and in columns, and are surrounded by a light screen.

14. The method of claim 13, wherein:
    the light screen includes chrome.

15. The method of claim 13, wherein:

the light screen has a line width of about 0.1 μm or more.

16. The method of claim 13, wherein:

the pattern forming step is carried out with a positive photoresist; and the comparing step is carried out for a size of the spaces of patterns in which phase is shifted with a size of the spaces of patterns in which phase is not shifted.

17. The method of claim 13, wherein:

the pattern forming step is carried out with a negative photoresist; and the comparing step is carried out for a size of the line of patterns in which phase is shifted with a size of the line of patterns in which phase is not shifted.

18. The method of claim 1, wherein the pattern forming step constitutes:

forming a contact hole pattern.

19. The method of claim 1, wherein the pattern forming step constitutes:

forming a line and space pattern.

* * * * *